United States Patent
Gauthier et al.

(10) Patent No.: US 6,788,045 B2
(45) Date of Patent: Sep. 7, 2004

(54) METHOD AND APPARATUS FOR CALIBRATING A DELAY LOCKED LOOP CHARGE PUMP CURRENT

(75) Inventors: Claude R. Gauthier, Fremont, CA (US); Brian W. Amick, Austin, TX (US); Pradeep Trivedi, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 320 days.

(21) Appl. No.: 10/147,594

(22) Filed: May 17, 2002

(65) Prior Publication Data

US 2003/0214280 A1 Nov. 20, 2003

(51) Int. Cl.[7] ............................................. G01R 23/12
(52) U.S. Cl. ................................... 324/76.53; 327/230
(58) Field of Search ........................ 324/76.53; 327/230

(56) References Cited

U.S. PATENT DOCUMENTS

| | | | | |
|---|---|---|---|---|
| 5,994,938 A | * | 11/1999 | Lesmeister | 327/277 |
| 6,121,808 A | * | 9/2000 | Gaudet | 327/231 |
| 6,411,142 B1 | * | 6/2002 | Abbasi et al. | 327/156 |
| 6,441,659 B1 | * | 8/2002 | Demone | 327/156 |
| 6,467,013 B1 | * | 10/2002 | Nizar | 711/1 |
| 6,680,634 B1 | * | 1/2004 | Ruha et al. | 327/158 |
| 2002/0067193 A1 | * | 6/2002 | Abbasi et al. | 327/156 |

OTHER PUBLICATIONS

"Low–Jitter Process–Independent DLL and PLL Based on Self–Biased Techniques," by John G. Maneatis, IEEE Journal of Solid–State Circuits, vol. 31, No. 11, Nov. 1996 (10 pgs).

* cited by examiner

Primary Examiner—Charles H. Nolan, Jr.
(74) Attorney, Agent, or Firm—Osha & May L.L.P.

(57) ABSTRACT

A calibration and adjustment system for post-fabrication control of a delay locked loop charge pump current is provided. The calibration and adjustment system includes an adjustment device that varies an amount of charge pump current. Such control of the charge pump current in a delay locked loop allows a designer to achieve a desired delay locked loop operating characteristic after the delay locked loop has been fabricated. A representative value of the amount of adjustment desired in the charge pump current may be stored and subsequently read to adjust the delay locked loop.

21 Claims, 8 Drawing Sheets

METHOD AND APPARATUS FOR CALIBRATING A DELAY LOCKED LOOP CHARGE PUMP CURRENT

BACKGROUND OF THE INVENTION

To increase processor performance, clock frequencies used by microprocessors, often referred to as "CPUs", have increased. Also, as the number of circuits that can be used in a CPU has increased, the number of parallel operations has risen. As processor performance continues to increase, the result has been a larger number of circuits switching at faster rates. Thus, from a design perspective, important considerations, such as switching noise and signal integrity must be taken into account.

As the frequencies of modem computers continue to increase, the need to rapidly transmit data between chip interfaces also increases. To accurately receive data, a clock signal is often transmitted to help recover the data. The clock signal determines when the data should be sampled by a receiver's circuits. The clock signal may change state at the beginning of the time the data is valid. The receiver operates better when the clock signal is detected during the middle of the time the data is valid. Also, the clock signal may degrade as it travels from its transmission point. In both circumstances, a delay locked loop (DLL) can generate a copy of the clock signal at a fixed phase shift with respect to the original clock signal.

FIG. 1 shows a block diagram of typical computer system components (5). Data (8) that is 'N' bits wide is transmitted from circuit A (6) to circuit B (7). To aid in the recovery of the transmitted data, a clock signal (9) is also transmitted with the data (8). The circuits (6,7) could also have a path (not shown) to transmit data from circuit B (7) to circuit A (6) along with an associated clock (not shown). The clock signal (9) may change from one state to another at the beginning of the data transmission to indicate when the data should be latched. A transition of the clock signal (9) temporally located some time after the beginning of when the data becomes valid is required for Circuit B (7) to properly latch the data. Furthermore, the clock signal (9) may have degraded during transmission. A DLL regenerates the clock signal (9) to a valid voltage and creates a phase shifted version of the clock signal to be used by other circuits, for example, a receiver's latching signal. The receiver's latching signal determines when the input to the receiver should be latched or sampled. The performance of a DLL is critical, and the DLL must maintain a proper reference of time with respect to a global clock signal on the CPU, or generically, an integrated circuit.

One common performance measure for a DLL is jitter. Jitter is the time domain error from poor spectral purity of an output. In other words, the clock signal (9) plus a known phase shift, should track the DLL output. For a signal with a repeated pattern, such as a clock signal, a transition that occurs from one state to another that does not occur at the same time relative to other transitions is said to have jitter. Jitter represents the perturbations that result in intermittent shortening or lengthening of signal elements. The DLL input, clock signal (9), may itself have jitter that may need to be transmitted to the DLL output. The DLL, however, may need to filter jitter created by other sources, such as power supply noise.

FIG. 2 shows a block diagram drawing of a representative DLL (200). Clock signal (201) is input to the DLL (200) to create a phased (i.e., delayed) output. Clock signal (201) is input to a voltage-controlled delay line (210) and to a phase detector (202). The phase detector (202) measures whether a phase difference between the clock signal (201) and an output, clk_out (217), of the delay path has the desired amount of delay. The phase detector (202) produces signals that control a charge pump (204). The phase detector (202) controls the charge pump (204) to increase or decrease its output current using signals up, U (203), and down, D (205). Internal biasing of the charge pump (204) maintains a nominal current output. The internal biasing of the charge pump (204) is dependent on bias signals $V_{BP}$ (209) and $V_{BN}$ (211). The signals up, U (203), and down, D (205), adjust the current output of the charge pump (204) with respect to the nominal current set by the control voltages, $V_{BP}$ (209) and $V_{BN}$ (211).

The charge pump (204) adds or removes charge from a capacitor $C_1$ (206), that changes a DC value at the input of a bias-generator (208). The capacitor, $C_1$ (206), is connected between a power supply, $V_{DD}$, and a control signal, $V_{CTRL}$ (207). The bias-generator (208) produces control voltages (or bias voltages), $V_{BP}$ (209) and $V_{BN}$ (211), in response to the control signal, $V_{CTRL}$ (207), that control the delay of the voltage-controlled delay line (210) and maintain a nominal current output from the charge pump (204).

In FIG. 2, the voltage-controlled delay line (210) may be implemented using current starved elements. This means that the delays are controlled by modifying the amount of current available for charging and discharging capacitances. The linearity of a voltage controlled delay line's characteristics determines the stable range of frequencies over which the delayed lock loop can operate. An output of the voltage-controlled delay line (210), clk_out (217), represents a phase delayed copy of clock signal (201) which is used by other circuits.

Still referring to FIG. 2, the negative feedback created by clk_out (217) in the DLL (200) adjusts the delay through the voltage-controlled delay line (210) by integrating the phase error that results between the clock signal (201) and clk_out (217). The voltage-controlled delay line (210) will delay clk_out (217) by a fixed amount of time such that a desired delay between clock signal (201) and clk_out (217) exists. The speed of the DLL (200) response to a phase error is often related to loop bandwidth.

Delay locked loops are basically first order feedback control systems. As such, the delay locked loop can be described in the frequency domain as having a loop gain and a loop bandwidth. The loop bandwidth is the speed at which a signal completes the feedback loop of the delay locked loop to produce an update (i.e., error signal). Ideally, the DLL should have a high bandwidth so that the clock signal and data track each other. Noise, such as power supply noise will, however, have a certain noise-versus-frequency characteristic that may require the loop bandwidth to be reduced to attenuate the effects of the noise. The loop bandwidth determines to a large degree what portion of power supply noise is translated to jitter in the output of the DLL (200).

SUMMARY OF INVENTION

According to one aspect of the present invention, an integrated circuit comprises a clock path for carrying a clock signal; a power supply path adapted to receive power from a power supply; a delay locked loop connected to the power supply path including a phase detector that detects a phase difference between a clock signal and a delayed clock signal, a charge pump responsive to the phase detector that outputs a current on a control signal, a bias generator responsive to the control signal that generates a bias voltage, and a voltage-controlled delay line responsive to the bias voltage that generates the delayed clock signal; an adjustment circuit operatively connected to the charge pump where the adjustment circuit is responsive to control information to adjust the current output from the charge pump; and a storage device adapted to store the control information to which the adjustment circuit is responsive.

According to one aspect of the present invention, a method for post-fabrication treatment of a delay locked loop comprises generating a delayed clock signal using a voltage-controlled delay line; comparing the delayed clock signal to a clock signal; generating a current signal using a charge pump responsive to the comparing; selectively adjusting the current signal using an adjustment circuit operatively connected to the charge pump; generating a bias voltage to the voltage-controlled delay line dependent on the selectively adjusting; and storing control information determined from the selectively adjusting.

According to one aspect of the present invention, an integrated circuit comprises delay locked loop means for generating a delayed clock signal where the delay locked loop means comprises comparing means for detecting a phase difference between a clock signal and the delayed clock signal, charge pumping means for generating a current on a control signal where the charge pumping means is responsive to the comparing means, bias generating means for generating a bias voltage where the bias generating means is responsive to the control signal, and delaying means for generating the delayed clock signal where the delaying means is responsive to the bias voltage; adjusting means for selectively adjusting the current output from the charge pump where the charge pumping means is responsive to the adjusting means; and storing means for storing a control information determined using the adjusting means.

Other aspects and advantages of the invention will be apparent from the following description and the appended claims.

DETAILED DESCRIPTION

Figure 1:
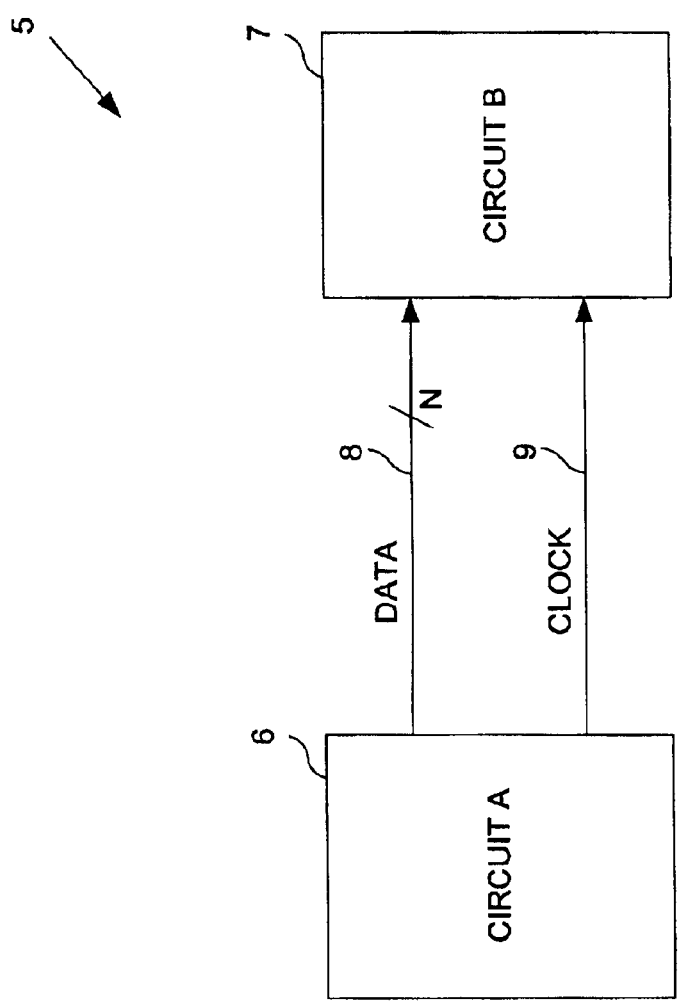
FIG. 1 shows a typical computer system component.

Exemplary embodiments of the invention will be described with reference to the accompanying drawings. Like items in the drawings are shown with the same reference numbers.

Embodiments of the present invention relate to an adjustment and calibration system for post-fabrication adjustment of an internal bias of a DLL charge pump. The adjustment and calibration system includes an adjustment circuit that may change a nominal current produced on the output of the charge pump. The change in nominal current produced on the output of the charge pump adjusts the current output of a control signal. A bias voltage that is responsive to the control signal is operatively connected to a voltage-controlled delay line. The adjustment circuit allows modification of the output of the charge pump, and consequently adjusts an operating characteristic of the DLL, through a test processor unit. The adjustment and calibration system may also store control information representative of the desired amount of adjustment of the output of the charge pump.

In a DLL, several operating characteristics may be important indicators of good performance. For example, operating characteristics such as a DLL's response to jitter, possible phase delay range using the minimum and maximum input clock signal frequency, lock time, etc. may be important considerations. The ability to ensure the desired operating characteristics after the DLL is fabricated is not always possible.

For example, jitter can be a function of various parameters: power supply variation, input and output jitter, loop bandwidth, substrate noise, etc. Although a designer may intend for an integrated circuit to have particular values for these parameters, actual values for these parameters are typically unknown until the integrated circuit has been fabricated (i.e., in a post-fabrication stage). For example, a designer may intend for the loop bandwidth of the DLL to be within in a particular range. The loop bandwidth may be unintentionally affected by many factors in the fabrication process. Because the loop bandwidth cannot be redesigned in the post-fabrication stage without considerable temporal and monetary expenditures, these fabrication factors may cause the DLL to have a different loop bandwidth range than the range it was designed to have and therefore may have poor jitter performance. Accordingly, there is a need for a technique and design that facilitates increased post-fabrication control of a DLL.

Figure 2:
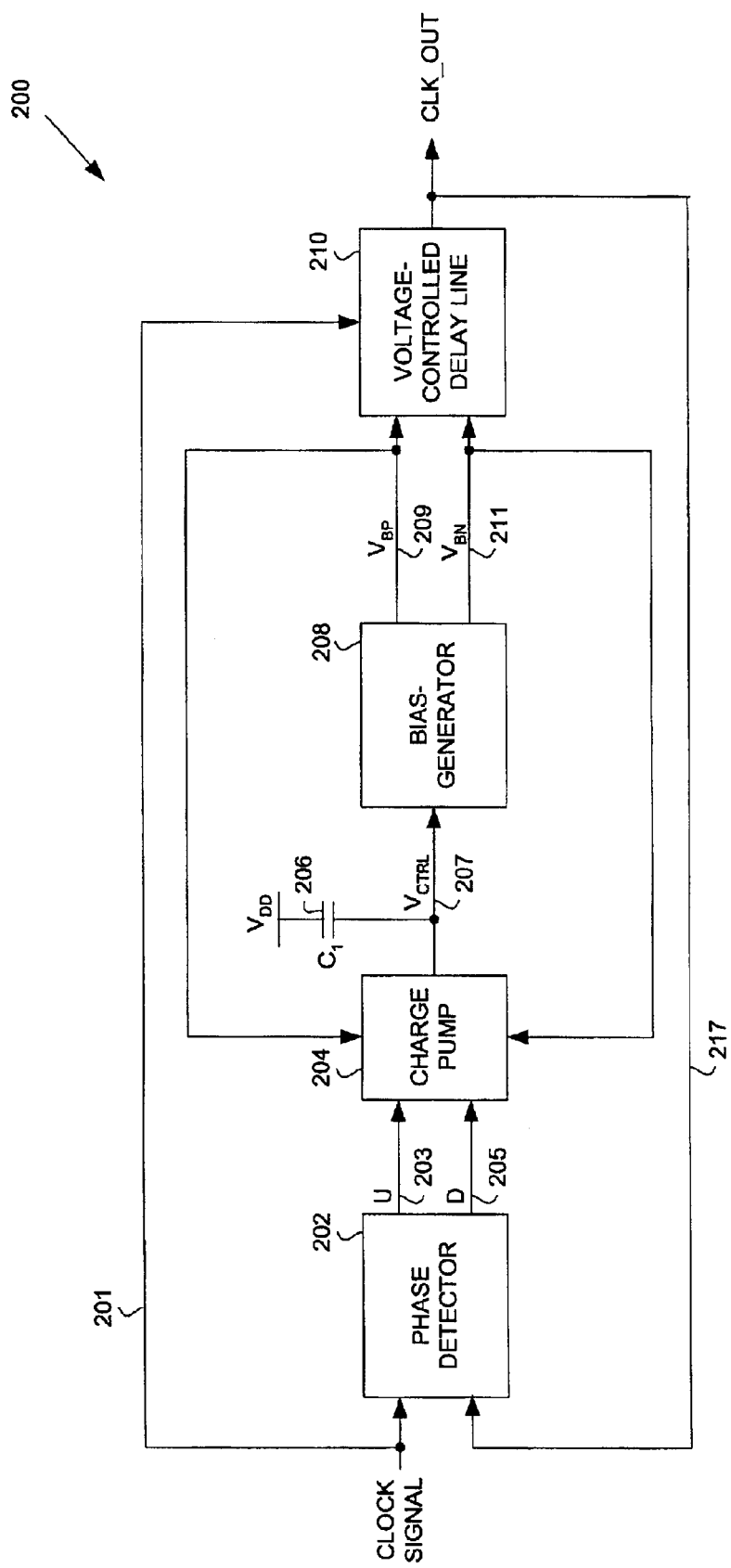
FIG. 2 shows a prior art delay locked loop block diagram.

In FIG. 2, the frequency response of the representative DLL (200) may be analyzed with a Laplace transform approximation, where the sample operation of the phase detector is ignored. This approximation is useful for loop bandwidths about a decade or more below the operating frequency of the DLL. This loop bandwidth constraint is also required for stability due to reduced phase margin near the higher order poles that result from the delay around the sampled feedback loop. The DLL has a first-order closed loop response. The response could be formulated in terms of input phase and output phase. This set of variables, however, is incompatible with a continuous time analysis since the sampled nature of the system would need to be considered. A better set of variables is input delay and output delay. The output delay is the delay between clock signal (201) and the DLL output, clk_out (217), or equivalently, the delay established by the voltage-controlled delay line (210). The input delay is the delay for which the phase detector (202) and charge pump (204) generate no error signal. The output delay, $D_O(S)$, is related to the input delay, $D_I(s)$, by the input-to-output transfer function, $D_O(s)/D_I(s)=1/(1+s/p)$, assuming no delay due to noise. The variable p (in rads/s) is the pole of the loop as determined by the charge pump (204) current, the phase detector (202) and voltage-controlled delay line (210) gain, and the capacitor $C_1$ (206).

Figure 3:
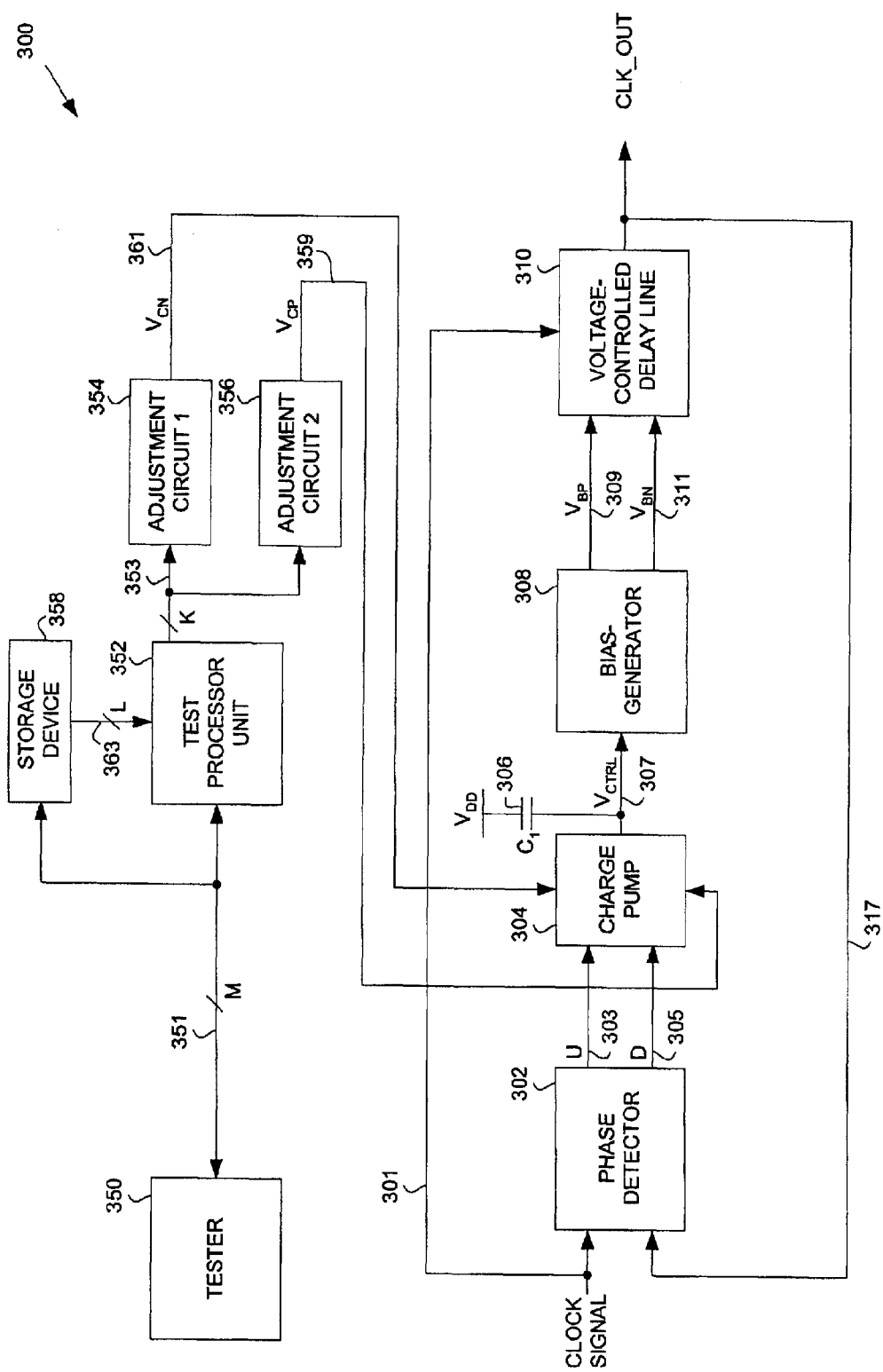
FIG. 3 shows an adjustable delay locked loop with a storage device block diagram in accordance with an embodiment of the present invention.

FIG. 3 shows an embodiment of an adjustable DLL (300) in accordance with the invention. The phase detector (302), capacitor $C_1$ (306), bias-generator (308) and voltage-controlled delay line (310) of the adjustable DLL (300) may operate similarly to the DLL (200 in FIG. 2) as previously described. The charge pump (304) is modified from the charge pump (204 in FIG. 2) to connect to control voltages $V_{CN}$ (361) and $V_{CP}$ (359), respectively, generated from adjustment circuits (354, 356), and a local bias circuit (internal to the charge pump (304) and shown as 550 in FIG. 5). The adjustment circuits (354, 356) are used to adjust the nominal current produced by the charge pump (304). The local bias circuit is used because the control voltages $V_{BP}$ (309) and $V_{BN}$ (311) are no longer connected to the charge pump (304) to set a nominal current output of the charge pump (304) as in the prior art DLL (200) shown in FIG. 2.

In FIG. 3, a test processor unit (352) controls the adjustment circuits (354, 356) using multiple adjustment signals K (353). The values of the multiple adjustment signals K (353) are determined by the test processor unit (352). The test processor unit (352) may communicate through a host interface (not shown) using M communication lines (351). Those with ordinary skill in the art will appreciate that the host interface and M communication lines (351) may take a wide variety of forms. The communication may be defined by an industry standard.

The host interface (not shown) may be used to operatively connect to a separate computer system. For example, a tester (350) may communicate with the test processor unit (352). The tester (350) may instruct the test processor unit (352) to adjust adjustment circuit (354) and/or adjustment circuit (356) to modify an operating characteristics of the adjustable DLL (300). The tester (350) may measure an operating characteristic of the adjustable DLL (300) or a representative operating characteristic of an integrated circuit on which the adjustable DLL (300) resides to determine the effect of the adjustment. A variety of different adjustments may be made in an effort to identify the adjustment settings that produce the desired operating characteristics of the adjustable DLL (300).

For example, the tester (350) may be used to adjust the adjustable DLL (300) until the optimal clock signal jitter performance is achieved. The tester (350) may also be used to adjust the adjustable DLL (300) until the optimal power supply jitter performance is achieved. Also, the tester (350) may be used to adjust the adjustable DLL (300) until the operating characteristics of the adjustable DLL (300) reaches a desired performance level. The operating characteristics may include jitter response, maximum operating frequency, minimum operating frequency, lock time, etc.

A storage device (358) may be designed to store control information representative of the adjustment settings that produce the desired operating characteristics of the adjustable DLL (300). By using the tester (350), control information may be written into the storage device (358). The tester (350) may read or rewrite the control information in the storage device (358).

The storage device (358) may include multiple storage elements such that the control information may be represented by a binary word.

For example, the control information stored in the storage device (358) may be a binary word that matches the values of the multiple adjustment signals K (353). Alternatively, the control information may be a binary encoded word. For example, if the multiple adjustment signals K (353) used eight adjustment signals, the control information might be represented with a three bit binary word. Alternatively, the control information may contain instructions, interpreted by the test processor unit (352), to control the multiple adjustment signals K (353).

In FIG. 3, the tester (350) may be removed from the adjustable DLL (300). The test processor unit (352) may read the storage device (358) to obtain the control information and determine the amount of adjustment that should occur in adjustment circuit (354) and/or adjustment circuit (356). The adjustable DLL (300), after the test processor unit (352) reads the control information in the storage device (358) and adjusts the adjustment circuit (354) and/or adjustment circuit (356), may have an operating characteristic similar to the operating characteristics obtained while connected to the tester (350). The test processor unit (352) reads the control information from storage device (358) using the L signal lines (363).

Those skilled in the art will appreciate that the adjustable DLL (300) may be analog, digital, or a combination of both types of circuits.

Figure 4:
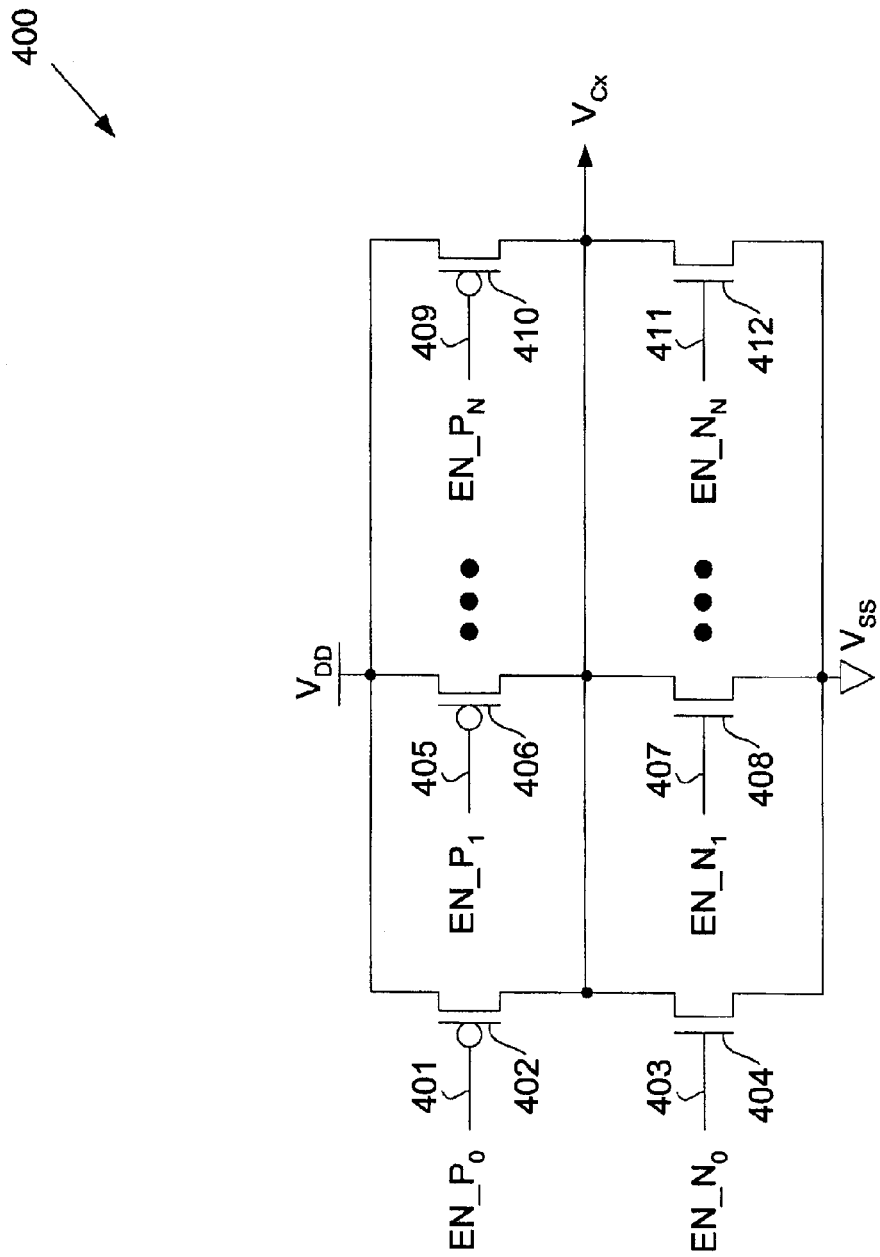
FIG. 4 shows an adjustment circuit schematic diagram in accordance with an embodiment of the present invention.

FIG. 4 shows an embodiment in accordance with the invention. An adjustment circuit (400) may include multiple p-channel transistors (402, 406, 410) arranged in parallel with each other. The multiple p-channel transistors (402, 406, 410) connect between the power supply $V_{DD}$ and a common node, $V_{Cx}$, where "x" is substituted by "N" or "P" depending on the whether the adjustment circuit (400) produces control voltage $V_{CN}$ (361 in FIG. 3) or control voltage $V_{CP}$ (359 in FIG. 3). The adjustment circuit (400) also includes multiple n-channel transistors (404, 408, 412) arranged in parallel with each other. The multiple n-channel transistors (404, 408, 412) connect between ground, $V_{SS}$, and a common node, $V_{Cx}$. Each transistor may have an individual control signal to turn "on" or "off" one or more of the p-channel transistors (402, 406, 410) or n-channel transistors (404, 408, 412). The p-channel transistors (402, 406, 410) have control signals EN_$P_0$ (401), EN_$P_1$ (405), and EN_$P_N$ (409) connected to their gates, respectively. The n-channel transistors (404, 408, 412) have control signals EN_$N_0$ (403), EN_$N_1$ (407), and EN_$N_N$ (411) connected to their gates, respectively. A "low" voltage on any of the EN_$P_X$ signals (401, 405, 409) will turn "on" their respective p-channel transistors (402, 406, 410). A "high" voltage on any of the EN_$N_X$ signals (403, 407, 411) will turn "on" their respective n-channel transistors (404, 408, 412).

Any p-channel transistor (402, 406, 410) that is "on" will change the voltage on $V_{Cx}$ toward $V_{DD}$. Any n-channel transistor (404, 408, 412) that is "on" will change the voltage on $V_{Cx}$ toward $V_{SS}$. By selecting which p-channel transistors (402, 406, 410) and/or n-channel transistors (404, 408, 412) are "on", a selected change in the voltage on $V_{Cx}$ may be achieved.

Those with ordinary skill in the art will appreciate that the p-channel transistors (402, 406, 410) and n-channel transistors (404, 408, 412) may be turned "on" individually or as a group. The p-channel transistors (402, 406, 410) and n-channel transistors (404, 408, 412) may be sized so that each transistor has a different effect compared to the other transistors. For example, the transistor's gate width may be varied to adjust the strength of each transistor. The gate widths of the p-channel transistors (402, 406, 410) and n-channel transistors (404, 408, 412) may be designed to provide a linear, exponential, or other function as more transistors are turn "on". The p-channel transistors (402, 406, 410) and n-channel transistors (404, 408, 412) may be sized so that each transistor has a different resistance. For example, the transistor gate lengths may be increased (i.e., long channel transistors) to increase the inherent resistance of each transistor. A larger inherent resistance may be advantageous if both a p-channel transistor and a n-channel transistor are "on" simultaneously. The adjustment circuit (400) may include only one p-channel transistor (e.g., p-channel transistor (402)) and one n-channel transistor (e.g., n-channel transistor (404)) connected in series.

The adjustment circuit (400) in FIG. 4 may be used as the adjustment circuits (354, 356) shown in FIG. 3. In FIG. 3, the test processor unit (352) generates a binary control word that determines which n-channel transistors and p-channel transistors are "on" and which are "off" in each of the adjustment circuits (354, 356). Depending on the binary control word maintained by the test processor unit (352), multiple adjustment signals K (353), that represent $EN\_N_X$ signals (403, 407, 411 in FIG. 4) and $EN\_P_X$ signals (401, 405, 409 in FIG. 4), may turn "on" or turn "off" the p-channel transistors (402, 406, 410 in FIG. 4) and n-channel transistors (404, 408, 412 in FIG. 4) in the adjustment circuits (354, 356). The common nodes $V_{CN}$ (361) and $V_{CP}$ (359) of the adjustment circuit (354, 356) may adjust the nominal current output of the charge pump (304).

Figure 5:
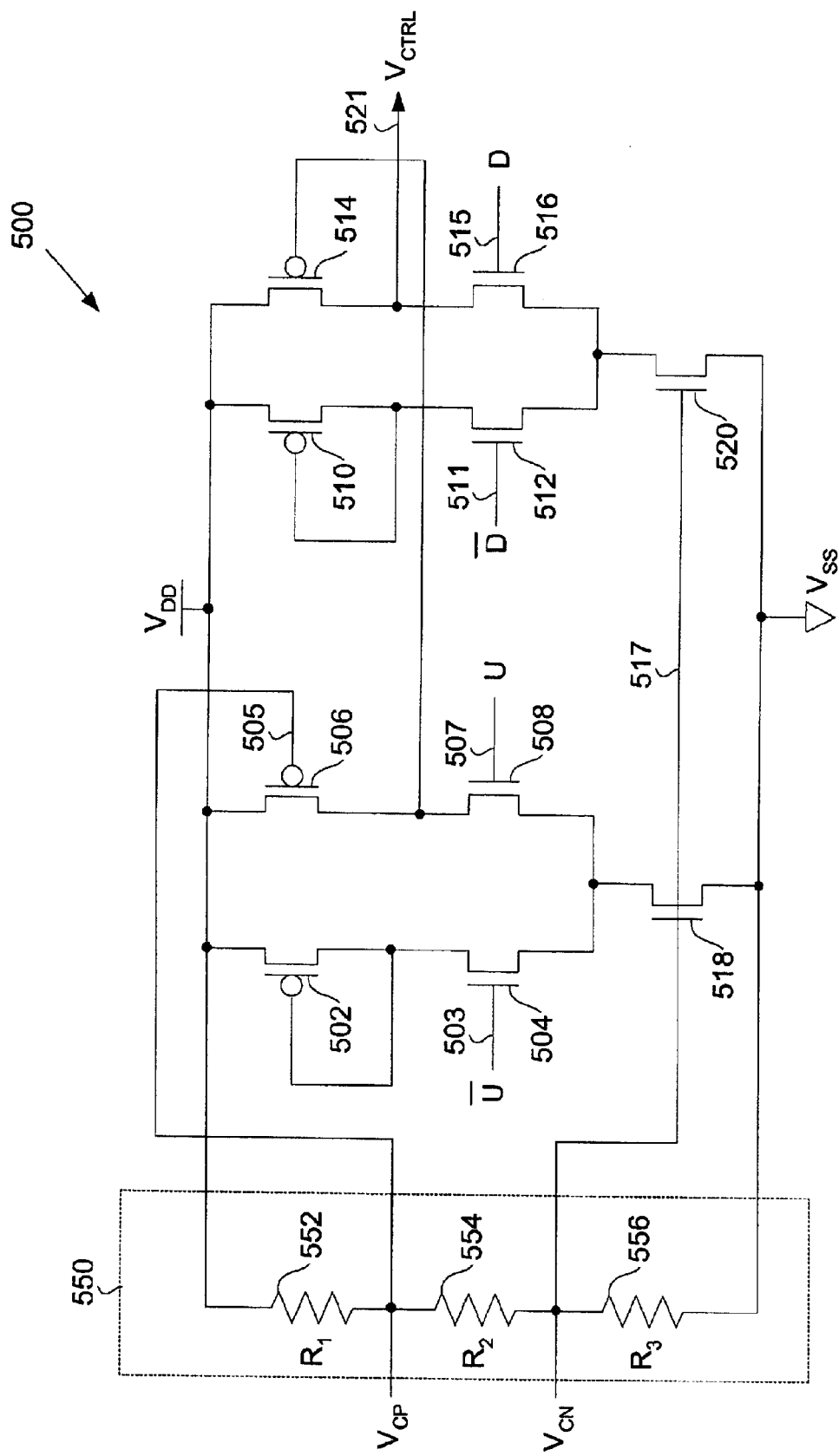
FIG. 5 shows a charge pump schematic diagram in accordance with an embodiment of the present invention.

FIG. 5 shows an embodiment of an adjustable charge pump (500) in accordance with the invention. The adjustable charge pump (500) that may be used for the charge pump (304 in FIG. 3) of the adjustable DLL (300 in FIG. 3). The charge pump (500) includes an internal biasing circuit (550) that is implemented using a voltage divider formed by resistors $R_1$ (552), $R_2$ (554), and $R_3$ (556). The internal biasing circuit (550) ensures that the charge pump (500) will have some nominal current flow. In order to be able to adjust the charge pump current value to achieve a desired operating characteristic, the adjustment circuit control voltages $V_{CN}$ (517) and $V_{CP}$ (505) (also shown in FIG. 3 as control voltages $V_{CN}$ (361) and $V_{CP}$ (359)) are operatively connected to the internal biasing circuit (550) of the adjustable charge pump (500). Thus, depending on the values of the resistors $R_1$ (552), $R_2$ (554), and $R_3$ (556) and the adjustment circuit control voltages $V_{CN}$ (517) and $V_{CP}$ (505), a first differential input stage formed by transistors (502, 504, 506, and 508) and a second differential input stage formed by transistors (510, 512, 514, and 516) control the output, $V_{CTRL}$ (521), of the adjustable charge pump (500). The first differential input stage is also responsive to U (507) pulses, and its inverse U (503), from the phase detector (302 shown in FIG. 3). The second differential input stage is also responsive to D (515) pulses, and its inverse D (511), from the phase detector (302 shown in FIG. 3). The current flow through the first and second differential input stages is regulated by transistors (518 and 520), respectively, where transistors (518 and 520) are responsive to the internal biasing circuit (550) and adjustment control voltages $V_{CN}$ (517) and $V_{CP}$ (505).

One of ordinary skill in the art will appreciate that even though multiple adjustment circuits (400) may be connected to the adjustable charge pump (500), it is possible that a few or none of the adjustment circuits may have an effect on the adjustable DLL (300 in FIG. 3), because adjustment circuits (354, 356 in FIG. 3) may be turned "off". Furthermore, an adjustment circuit (400) may be operatively connected to the adjustable charge pump (500) to affect a change in an operating characteristics of the adjustable DLL (300 in FIG. 3).

Figure 6A:
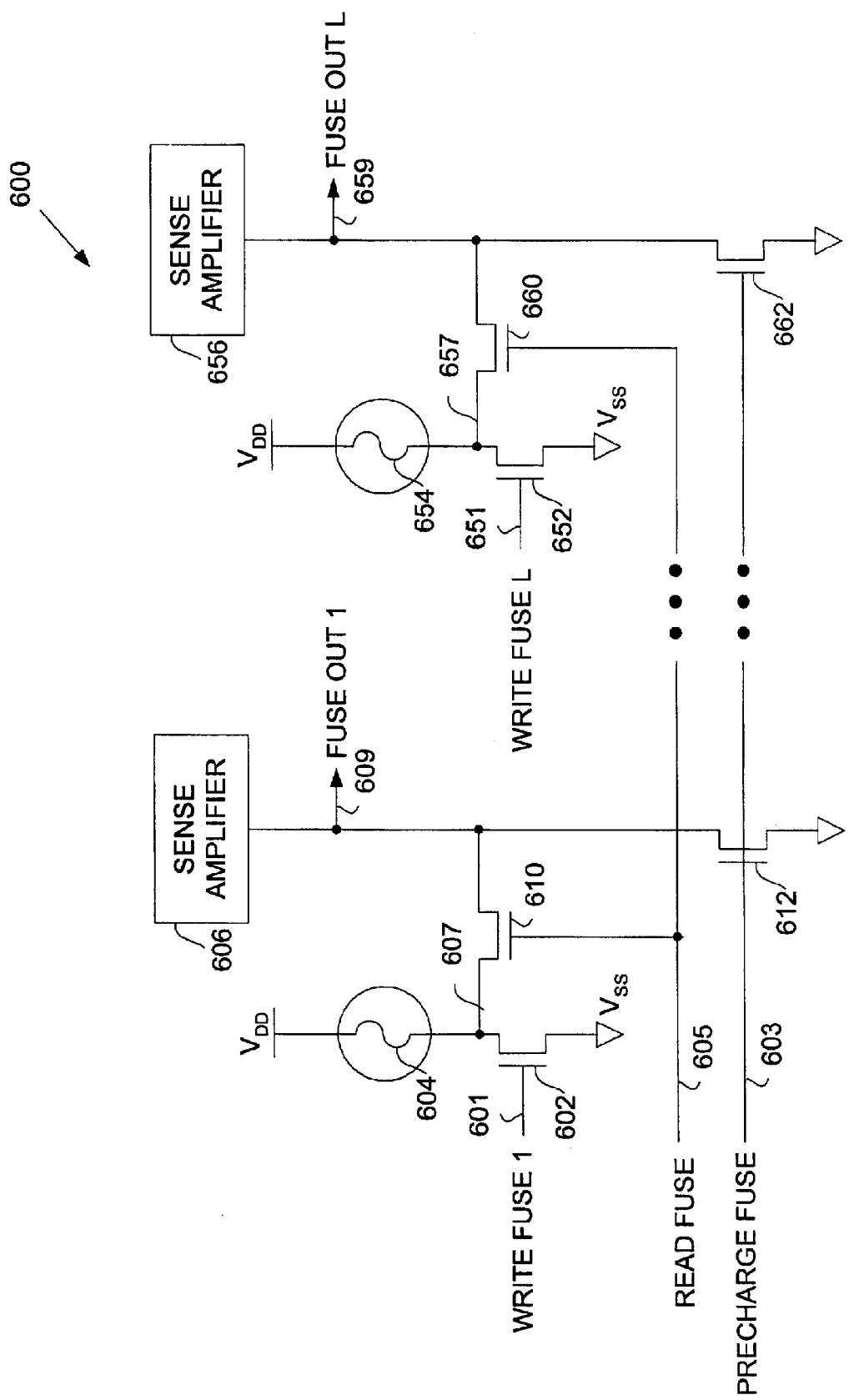
FIG. 6A shows a storage device schematic diagram in accordance with an embodiment of the present invention.

FIG. 6A shows an embodiment of a storage device (600) in accordance with the invention. The storage device (600) may be used for the storage device in the adjustable DLL shown at (358 in FIG. 3). The storage device (600) includes electrically programmable fuses (604, 654) to store nonvolatile control information.

In FIG. 6A, multiple write signals such as write fuse 1 (601) through write fuse L (651) are used to program electrically programmable fuses (604, 654), respectively. A "high" voltage on write fuse 1 (601) and write fuse L (651) cause n-channel transistors (602, 652), respectively, to turn "on." If n-channel transistors (602, 652) are "on" for a sufficient duration, the fuse (604) and fuse (654), respectively, will create an "open" circuit. A precharge fuse (603) signal will pulse a "high" voltage on the gates of n-channel transistors (612, 662) to momentarily turn them "on." If n-channel transistors (612, 662) are "on," fuse out 1 (609) and fuse out L (659) will be pulled to a "low" voltage by n-channel transistors (612, 662). The "low" voltage on fuse out 1 (609) and fuse out L (659) will precharge fuse out 1 (609) and fuse out L (659) in anticipation of a read operation.

In FIG. 6A, a "high" voltage on read fuse (605) will cause n-channel transistors (610, 660) to turn "on." If any of the fuses (604, 654) are intact (i.e., shorted), fuse out 1 (609) and fuse out L (659) will be pulled to a "high" voltage. If any of the fuses (604, 654) are open, fuse out 1 (609) and fuse out L (659) will remain at a "low" voltage. The sense amplifiers (606, 656) will sense the voltage levels on fuse out 1 (609) and fuse out L (659), respectively, to amplify and maintain the voltage levels.

Figure 6B:
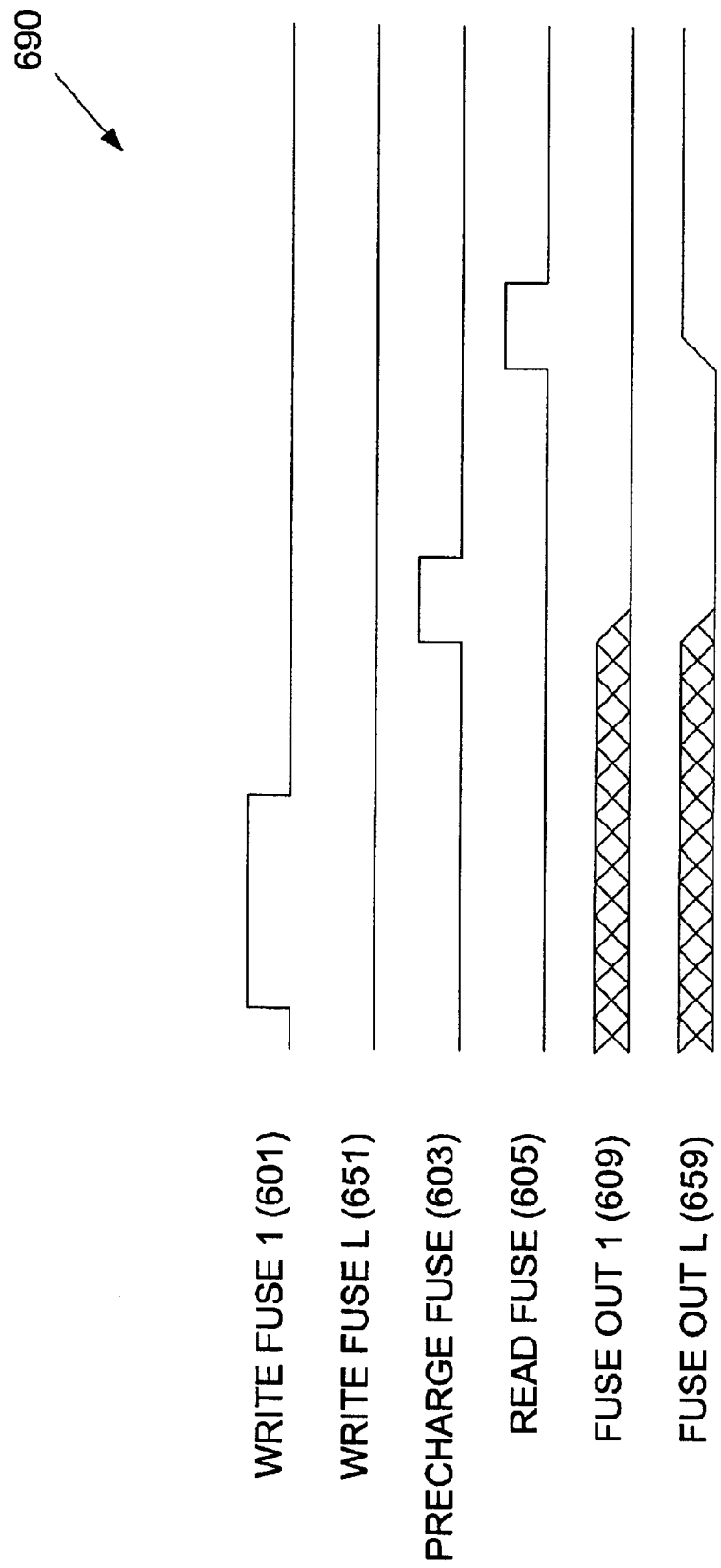
FIG. 6B shows a timing diagram in accordance with an embodiment of the present invention for the storage device schematic diagram shown in FIG. 6A.

FIG. 6B shows a timing diagram (690) related to the programming of storage device (600) in accordance with an embodiment of the present invention. In this example, write fuse 1 (601) is pulsed to a "high" voltage to create an "open" on fuse (604). Write fuse L (651) remains at a "low" voltage to leave fuse (604) intact. Precharge fuse (603) signal pulses a "high" voltage to pull fuse out 1 (609) and fuse out L (659) to a "low" voltage. Read fuse (605) pulses a "high" voltage to read the state of the fuses (604, 654). Because fuse (604) is "open", fuse out 1 (609) remains at a "low" voltage. Because fuse (654) is intact or "shorted", fuse out L (659) is pulled to a "high" voltage.

Because the fuses (604, 654) have been programmed and read, fuse out 1 (609) and fuse out L (659) maintain the programmed control information. The state of the fuses (604, 654) may be read at any time by observing the voltage level on fuse out 1 (609) and fuse out L (659). Also, the state of the fuses (604, 654) may be read by repeating the precharge and read cycles. Using multiple fuses and related circuitry, a binary word may represent the stored control information.

One of ordinary skill in the art will appreciate that the electrically programmable fuses are but one method to store information. The storage device (358 in FIG. 3) may contain a wide variety of types of storage elements including, but not limited to, an electrically programmable fuse, an electrically programmable read only memory, an electrically erasable read only memory, a one time programmable memory, a flash memory, a laser programmable fuse, and a laser programable anti-fuse.

Figure 7:
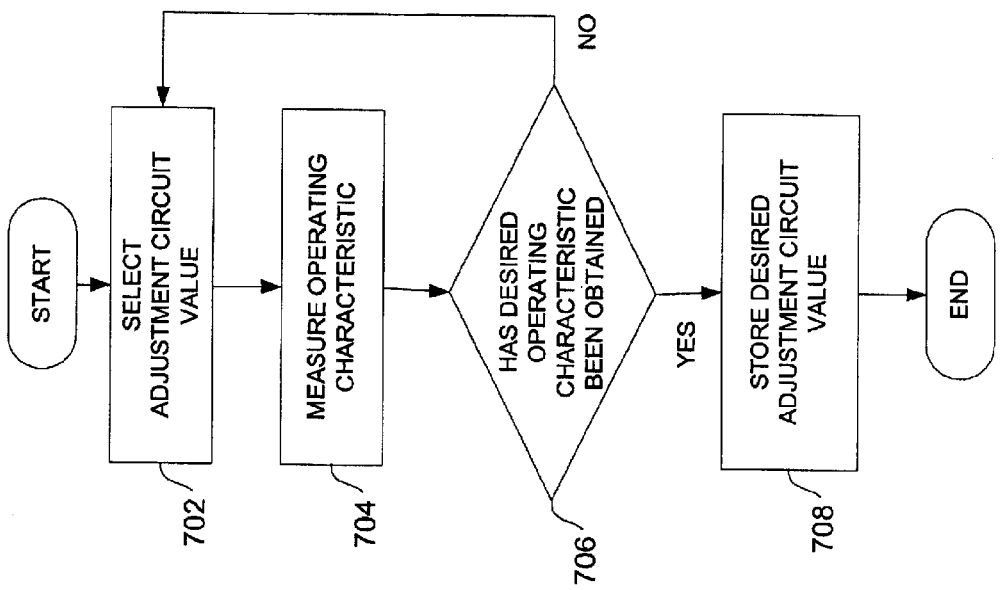
FIG. 7 shows a flow diagram in accordance with an embodiment of the present invention.

FIG. 7 shows a flow diagram in accordance with an embodiment of a method according to the invention. At (702), an adjustment circuit value is selected. The selected adjustment value may be used to adjust adjustment circuits (354, 356 shown in FIG. 3). The adjustment circuits (354, 356 shown in FIG. 3) may create an offset in the current output (i.e., current signal) of the charge pump (304 in FIG. 3). The adjustment of the current signal from the charge pump (304 in FIG. 3) modifies an operating characteristic of the adjustable DLL (300 in FIG. 3). For example, the jitter of the adjustable DLL (300 in FIG. 3) may be measured as the clock signal (301 in FIG. 3) is jittered or the power supply noise is modified. Also, the performance of other circuits that rely on the adjustable DLL (300 in FIG. 3) may be measured. At (704), the operating characteristics are measured.

At (706) a determination as to whether a desired operating characteristic(s) is obtained. The determination may be based on an operating characteristic(s) taken with the selected adjustment circuit value, or an interpolation or extrapolation from data obtained from selectively adjusting the adjustment circuit value. If the desired operating characteristic(s) has not been obtained, (702) and (704) are repeated until a desired operating characteristic(s) has been obtained. If the desired operating characteristic(s) has been obtained, the adjustment circuit value, or a representation of the value, is stored at (708). The desired adjustment circuit value or representation of the value is stored as control information in the storage device (358 in FIG. 3). The storage device (358 in FIG. 3) may contain control information that may be accessed and used to improve the performance of the adjustable DLL (300 in FIG. 3) after fabrication.

Advantages of the present invention may include one or more of the following. The adjustable DLL (300 in FIG. 3), having been fabricated, may demonstrate operating characteristics that may not have been apparent from simulation. In some embodiments, because the adjustment circuits (354, 356 in FIG. 3) may modify the operating characteristics of the adjustable DLL (300 in FIG. 3), the adjustable DLL (300 in FIG. 3) may be calibrated.

In some embodiments, because the adjustable DLL (300 in FIG. 3) may be fabricated with a means for adjusting the current output of the charge pump (304 in FIG. 3), fewer design iterations and higher confidence in the adjustable DLL (300 in FIG. 3) operating characteristics may be afforded. Likewise, the adjustable DLL (300 in FIG. 3) response to various system disturbances such as power supply noise and system clock signal jitter may be realistically determined and calibrated to minimize these effects.

In some embodiments, the tester (350 in FIG. 3) and test processor unit 352 in FIG. 3) may communicate so that the state of the adjustable DLL (300 in FIG. 3) may be obtained, performance characteristics analyzed, and/or adjustments made to the adjustable DLL (300 in FIG. 3). By using the tester (350 in FIG. 3), control information may be stored in a storage device (358 in FIG. 3).

In some embodiments, the tester (350 in FIG. 3) may take a relatively long time to determine the desired value and program the control information. Because the control information is programmed, the adjustable DLL (300 in FIG. 3) and the integrated circuit on which it resides may quickly (for example, within a few nanoseconds) adjust the adjustable DLL (300 in FIG. 3) to obtain proper operation.

In some embodiments, a limited number of adjustable DLLs (300 in FIG. 3) may need to be tested to determine the desired value for the control information for a larger number of adjustable DLLs (300 in FIG. 3).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a clock path for carrying a clock signal;
   a power supply path adapted to receive power from a power supply;
   a delay locked loop connected to the power supply path, comprising:
      a phase detector that detects a phase difference between the clock signal and a delayed clock signal,
      charge pump, responsive to the phase detector, that outputs a current on a control signal,
      a bias generator, responsive to the control signal, that generates a bias voltage, and
      a voltage-controlled delay line, responsive to the bias voltage, that generates the delayed clock signal;
   an adjustment circuit operatively connected to the charge pump, wherein the adjustment circuit is responsive to control information to adjust the current output from the charge pump; and
   a storage device adapted to store the control information to which the adjustment circuit is responsive.

2. The integrated circuit of claim 1, wherein the adjustment circuit comprises a first switch to provide current flow between a first voltage provided by the power supply path and an output of the adjustment circuit, and a second switch to provide current flow between a second voltage provided by the power supply path and the output of the adjustment circuit.

3. The integrated circuit of claim 1, wherein the adjustment circuit comprises a first p-channel transistor and a first n-channel transistor connected in series.

4. The integrated circuit of claim 3, the adjustment circuit further comprising:
   a second p-channel transistor connected in parallel with the first p-channel transistor; and
   a second n-channel transistor connected in parallel with the first n-channel transistor, wherein the first p-channel transistor and second p-channel transistor are in series with the first n-channel transistor and second n-channel transistor.

5. The integrated circuit of claim 1, wherein the storage device comprises a storage element selected from a group consisting of an electrically programmed fuse, an electrically programmed read only memory, an electrically erasable read only memory, a one time programmable memory, and a flash memory.

6. The integrated circuit of claim 1, wherein the storage device comprises a storage element selected from a group consisting of a laser programmable fuse and a laser programmable anti-fuse.

7. The integrated circuit of claim 1, wherein the control information comprises a binary word.

8. The integrated circuit of claim 1, wherein the control information comprises an instruction.

9. The integrated circuit of claim 1, further comprising:
   a test processor unit operatively coupled to the storage device and the adjustment circuit.

10. The integrated circuit of claim 9, further comprising:
    a tester adapted to communicate with the test processor unit, and read at least a portion of the control information in the storage device.

11. The integrated circuit of claim 9, further comprising:
    a tester adapted to communicate with the test processor unit, and write at least a portion of the control information in the storage device.

12. A method for post-fabrication treatment of a delay locked loop, comprising:
    generating a delayed clock signal using a voltage-controlled delay line;
    comparing the delayed clock signal to a clock signal;

generating a current signal using a charge pump responsive to the comparing;

selectively adjusting the current signal using an adjustment circuit operatively connected to the charge pump;

generating a bias voltage to the voltage-controlled delay line dependent on the selectively adjusting; and storing control information determined from the selectively adjusting.

13. The method of claim 12, wherein selectively adjusting the current signal comprises controlling a first current flow between a first voltage and an output of the adjustment circuit, and controlling a second current flow between a second voltage and the output of the adjustment circuit.

14. The method of claim 12, wherein selectively adjusting the current signal is performed by an adjustment circuit, wherein the adjustment circuit comprises a first p-channel transistor and a first n-channel transistor connected in series.

15. The method of claim 14, the adjustment circuit further comprising:

a second p-channel transistor connected in parallel with the first p-channel transistor; and a second n-channel transistor connected in parallel with the first n-channel transistor, wherein the first p-channel transistor and second p-channel transistor are in series with the first n-channel transistor and second n-channel transistor.

16. The method of claim 12, wherein the storing comprises at least one selected from a group consisting of electrically programming a fuse, electrically programming a read only memory, electrically erasing a read only memory, programming a one time programmable memory, and programing a flash memory.

17. The method of claim 12, wherein the storing comprises at least one selected from a group consisting of laser programming a fuse and laser programming an anti-fuse.

18. The method of claim 12, further comprising:

reading the control information using a test processor unit; and operatively controlling the selectively adjusting of the current signal with the test processor unit.

19. The method of claim 12, further comprising:

reading the control information using a tester; and instructing a test processor unit to adjust the current signal using the adjustment circuit operatively connected to the charge pump.

20. The method of claim 12, wherein the control information represents an offset in the current signal.

21. An integrated circuit, comprising:

delay locked loop means for generating a delayed clock signal, wherein the delay locked loop means comprises:

comparing means for detecting a phase difference between a clock signal and the delayed clock signal, charge pumping means for generating a current on a control signal, wherein the charge pumping means is responsive to the comparing means, bias generating means for generating a bias voltage, wherein the bias generating means is responsive to the control signal, and delaying means for generating the delayed clock signal, wherein the delaying means is responsive to the bias voltage;

adjusting means for selectively adjusting the current output from the charge pump, wherein the charge pumping means is responsive to the adjusting means; and storing means for storing control information determined using the adjusting means.

\* \* \* \* \*

UNITED STATES PATENT AND TRADEMARK OFFICE
CERTIFICATE OF CORRECTION

PATENT NO. : 6,788,045 B2
DATED : September 7, 2004
INVENTOR(S) : Claude R. Gauthier et al.

It is certified that error appears in the above-identified patent and that said Letters Patent is hereby corrected as shown below:

Column 10,
Line 5, please insert -- a -- before "charge pump".

Signed and Sealed this

Eighth Day of March, 2005

JON W. DUDAS
*Director of the United States Patent and Trademark Office*